United States Patent
Tzen et al.

(10) Patent No.: US 8,004,187 B2
(45) Date of Patent: Aug. 23, 2011

(54) ORGANIC ELECTRO-LUMINESCENCE DISPLAY HAVING AN INVERTED TRAPEZIFORM PATTERNED SEPARATOR STRUCTURE

(75) Inventors: Chih-Kwang Tzen, Pingtung County (TW); Chun-Chung Lu, Taichung County (TW); Shuenn-Jiun Tang, Hsinchu County (TW); Shih-Kuei Lo, Taoyuan County (TW); Jie-Huang Wu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 44 days.

(21) Appl. No.: 12/541,971

(22) Filed: Aug. 17, 2009

(65) Prior Publication Data
US 2009/0302753 A1 Dec. 10, 2009

Related U.S. Application Data

(62) Division of application No. 10/906,099, filed on Feb. 3, 2005, now Pat. No. 7,605,533.

(51) Int. Cl.
*H01J 1/64* (2006.01)
(52) U.S. Cl. ........................................ 313/506; 313/498
(58) Field of Classification Search ........... 313/498–512
See application file for complete search history.

(56) References Cited

U.S. PATENT DOCUMENTS
2005/0093435 A1* 5/2005 Suh et al. .................. 313/504
* cited by examiner

*Primary Examiner* — Joseph L Williams
(74) *Attorney, Agent, or Firm* — Jianq Chyun IP Office

(57) ABSTRACT

An organic electro-luminescence display includes an organic electro-luminescence device array, a first passivation layer completely covering organic electro-luminescence device array, and a plurality of color filters disposed on the first passivation layer. The color filters include a plurality of red color filters, green color filters, or blue color filters. The organic electro-luminescence device array includes a white light organic electro-luminescence device array. The type of the organic electro-luminescence device array includes an active matrix array or a passive matrix array.

7 Claims, 4 Drawing Sheets

ORGANIC ELECTRO-LUMINESCENCE DISPLAY HAVING AN INVERTED TRAPEZIFORM PATTERNED SEPARATOR STRUCTURE

CROSS-REFERENCE TO RELATED APPLICATION

This application is a divisional application of and claims priority benefit of an U.S. application Ser. No. 10/906,099, filed on Feb. 3, 2005, now pending. The entirety of the above-mentioned patent application is hereby incorporated by reference herein and made a part of this specification.

BACKGROUND OF THE INVENTION

1. Field of the Invention

The invention relates to an organic electro-luminescence display (OELD) and process of fabricating the same. More particularly, the invention relates to an organic electro-luminescence display and process of fabricating the same utilizing a color filter formed over an organic electro-luminescence device.

2. Description of Related Art

Panel displays serve as a communication interface between human and information, and the flat panel display is the leading trend. Wherein, the organic electro-luminescence display apparatus, with advantages such as self-luminescence, wide view angle, low power consumption, simple manufacturing process, low cost, low work temperature range, high responsive speed and full colors, has a great potential of becoming the mainstream flat panel display product in its next generation.

The organic electro-luminescence display utilizes the self-luminescence characteristic of the organic luminescent materials to achieve the display purpose. The emission structure of the organic electro-luminescence display is mainly composed of a pair of electrodes and an organic functional material layer. The emission mechanism of the organic electro-luminescence display works by currents flowing through the anode and the cathode, and electrons and holes meeting in the organic functional material layer to emit excitions. Thereby, the organic functional material layer with the emission mechanism will emit different colors according to the characteristics of its materials.

Because the life spans of the conventional organic luminescent materials are inconsistent, their applicability is limited. For instance, due to the different life spans of the red, green and blue organic luminescent materials, the colors fade away in different timing and thus the hues become unbalanced. In order to avoid the inconsistency of organic luminescent materials, researchers have developed an emission structure combining organic electro-luminescence devices and color filters to utilize a single-colored organic luminescent material in a single display apparatus.

However, the emission structure, combining the organic electro-luminescence devices and the color filters, may incur another problem. A solvent must be used when fabricating the color filters, but the solvent can damage the organic electro-luminescence devices formed over the substrate. The conventional solution is to form the color filters over the substrate after the organic electro-luminescence devices formed over the substrate are sealed.

FIG. 1 is a schematic drawing of a conventional back emission organic electro-luminescence display. As shown in FIG. 1, the organic electro-luminescence display 100 comprises a color filter glass 110, a substrate 120, a covering substrate 130, a plurality of sealants 140, a plurality of patterned separator structures 150, a plurality of organic electro-luminescence devices 160, and a plurality of color filters 170. Because the solvent, used when fabricating the color filters 170, can damage the organic electro-luminescence devices 160, the organic electro-luminescence devices 160 and the color filters 170 are fabricated respectively and then attached. Therefore, another glass substrate (the color filter glass 110) is required in the aforementioned fabricating process.

To sum up, the conventional process of fabricating the organic electro-luminescence display requires more glass substrates (for example, three pieces of the glass substrates are required as shown in FIG. 1). It not only increases the cost, but also the weight and thickness of the display apparatus. In addition, the process of aligning and attaching the organic electro-luminescence devices and the color filters is very complicated and time consuming.

SUMMARY OF THE INVENTION

Accordingly, the invention is directed to a thinner and cheaper organic electro-luminescence display adapted to promote its life span and display quality.

The invention is also directed to a process of fabricating a thinner and cheaper organic electro-luminescence display adapted to promote its life span and display quality.

According to an embodiment of the invention, an organic electro-luminescence display is disclosed, comprising a substrate, a plurality of organic electro-luminescence devices, a patterned separator structure, a first passivation layer and a plurality of color filters, wherein the organic electro-luminescence devices are disposed over the substrate. The patterned separator structure is disposed over the substrate to separate the organic electro-luminescence devices, wherein the patterned separator structure is thicker than the organic electro-luminescence devices. The first passivation layer completely covers the patterned separator structure and the organic electro-luminescence devices. The color filters are disposed on the first passivation layer and located above the organic electro-luminescence devices.

According to an embodiment of the invention, an organic electro-luminescence display is disclosed, comprising a substrate, a plurality of organic electro-luminescence devices, a patterned separator structure, a first passivation layer, a plurality of color filters and a second passivation layer, wherein the organic electro-luminescence devices are disposed over the substrate. The patterned separator structure is disposed over the substrate to separate the organic electro-luminescence devices, wherein the patterned separator structure is thicker than the organic electro-luminescence devices. The first passivation layer completely covers the patterned separator structure and the organic electro-luminescence devices. The color filters are disposed on the first passivation layer and located above the organic electro-luminescence devices. And the second passivation layer completely covers the first passivation layer and the color filters.

According to another embodiment of the invention, a process of fabricating an organic electro-luminescence display is disclosed, comprising the following steps. First, a substrate, a plurality of organic electro-luminescence devices and a patterned separator structure are provided, wherein the organic electro-luminescence devices and the patterned separator structure are disposed over the substrate. The patterned separator structure separates the organic electro-luminescence devices, and the patterned separator structure is thicker than the organic electro-luminescence devices. Next, a passivation layer is formed, which completely covers the patterned separator structure and the organic electro-luminescence devices. And then, the color filters are formed on the passivation layer, wherein the color filters are located above the organic electro-luminescence devices.

In accordance with an embodiment of the invention, the process of fabricating the organic electro-luminescence display further comprises forming a second passivation layer to completely cover the first passivation layer and the color filters.

According to the other embodiment of the invention, an organic electro-luminescence display is provided, comprising an organic electro-luminescence device array, a passivation layer and a plurality of color filters, wherein the passivation layer completely covers the organic electro-luminescence device array and the color filters are disposed on the passivation layer.

In accordance with an embodiment of the invention, the organic electro-luminescence display further comprises a second passivation layer to completely cover the first passivation layer and the color filters.

According to an aspect of the invention, the organic electro-luminescence display comprises the passivation layer between the organic electro-luminescence devices and the color filters, so the solvent will not damage the organic electro-luminescence devices when fabricating the color filters. Compared with the conventional art, the invention, the organic electro-luminescence display and process of fabricating the same, does not require the step of sealing the glass substrates onto the organic electro-luminescence devices first before the color filters are formed. Therefore the invention can decrease the number of the glass substrates utilized to reduce the thickness of the display apparatus and thus lower the cost effectively. Further, because the organic electro-luminescence display in the invention utilizes the same substrate to form the organic electro-luminescence devices and the color filters, the organic electro-luminescence devices will not be damaged, the fabricating process is simplified and the cost is reduced.

DESCRIPTION OF THE EMBODIMENTS

Various specific embodiments of the invention are disclosed below, illustrating examples of various possible implementations of the concepts of the invention. The following description is made for the purpose of illustrating the general principles of the invention and should not be taken in a limiting sense. The scope of the invention is best determined by reference to the appended claims.

Figure 1:
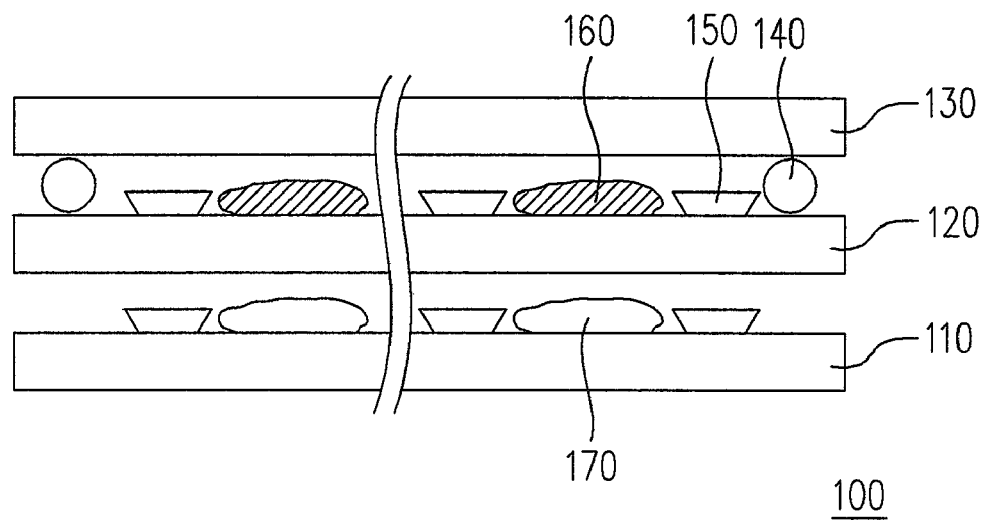
FIG. 1 is a schematic drawing of a conventional back emitting organic electro-luminescence display.
Figure 2:
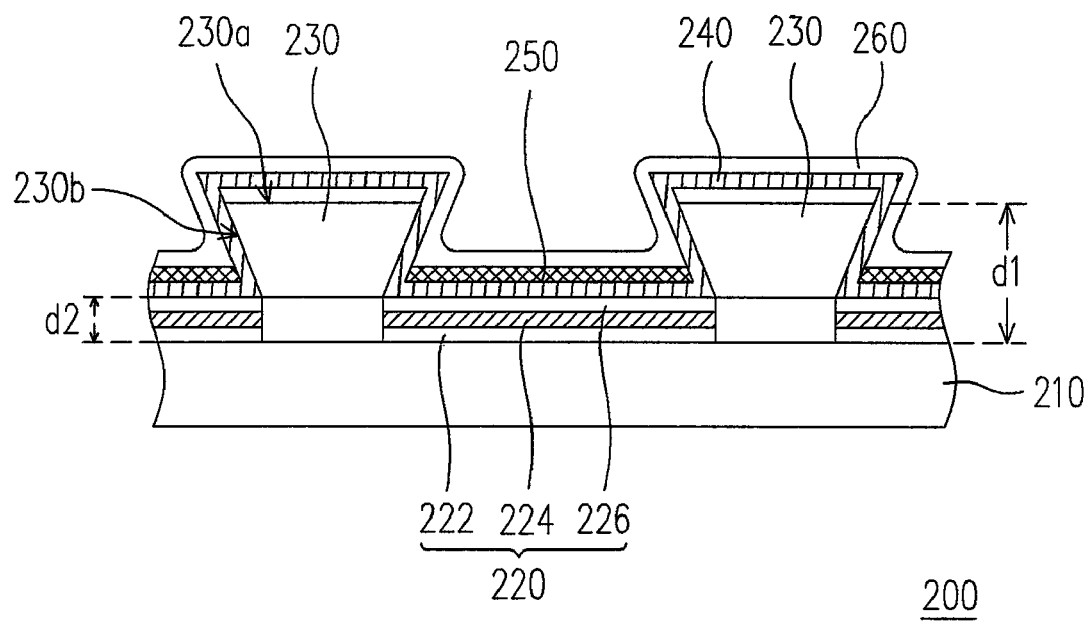
FIG. 2 is a cross sectional view of an organic electro-luminescence display according to one embodiment of the invention.

FIG. 2 is a cross sectional view of the organic electro-luminescence display according to one embodiment of the invention. As shown in FIG. 2, the invention, an organic electro-luminescence display 200, mainly comprises a substrate 210, a plurality of organic electro-luminescence devices 220, a patterned separator structure 230, a passivation layer 240 and a plurality of color filters 250.

As shown in FIG. 2, in one embodiment, the substrate 210 can be a transparent or non-transparent substrate, which can be made of glass, plastic or flexible materials. In addition, the type of organic electro-luminescence display 200 can be an active matrix or a passive matrix. When the type of display 200 is an active matrix, the substrate 210 can be an active matrix array substrate, such as a thin film transistor (TFT) array substrate.

Furthermore, the organic electro-luminescence devices 220 are disposed over the substrate 210. In one embodiment, the organic electro-luminescence devices 220 comprise a first electrode 222, an organic luminescent layer 224 and a second electrode 226, wherein the materials of the electrodes 222, 226 can be transparent or non-transparent electrical conductive materials. For example, the materials of the electrodes 222, 226 can be metal, metal-oxide, metal-nitride or metal-oxynitride, wherein the transparent electrical conductive material of the metal-oxide can be indium-tin-oxide (ITO) or indium-zinc-oxide (IZO). And the organic luminescent layer 224 of each organic electro-luminescence devices 220 can be white light or other colors.

With reference to FIG. 2, the patterned separator structure 230 is disposed over the substrate 210 to separate the organic electro-luminescence devices 220, wherein the thickness d1 of the patterned separator structure 230 is greater than thickness d2 of the organic electro-luminescence devices 220. Because the thickness difference between the patterned separator structure 230 and the organic electro-luminescence devices 220 is so great and the cross-section of the patterned separator structure 230 can be an inverted trapezium, the portion of the second electrode 226 over the substrate 210 and that over the patterned separator structure 230 can be disconnected, wherein the second electrode 226 is formed during the sputtering process or other deposition process.

In addition, the passivation layer 240 completely covers the patterned separator structure 230 and the organic electro-luminescence devices 220. In one embodiment, the passivation layer 240 can be made of transparent materials that enable lights to pass through. The passivation layer 240 can be made of a compound layer, such as a compound of inorganic layer and a polymeric layer. The process of fabricating the passivation layer 240 can be a plasma diffusion process. Through the plasma diffusion process, the complete and connected passivation layer 240 can be formed to cover the top and side surfaces 230a, 230b of the patterned separator structure 230 and to cover the organic electro-luminescence devices 220. The passivation layer 240 is used to effectively prevent the organic luminescent layer 224 from being damaged by the outside moisture or the organic solvent used when fabricating the color filters 250.

With reference to FIG. 2, the color filters 250 are disposed on the passivation layer 240 and are located above the organic electro-luminescence devices 220. In one embodiment, the colors of the color filters 250 comprise red, green and blue. By the color filters 250, the organic electro-luminescence display 200 can achieve the full color display. With the color filters 250, the organic electro-luminescence devices 220 can be the same material. This effectively prevents the situation that some materials of the conventional organic electro-luminescence devices may have different life spans and fade away in different timing.

Referring to FIG. 2, In one embodiment, the organic electro-luminescence display 200 further comprises another passivation layer 260 to completely cover the passivation layer 240 and the color filters 250, wherein the color filters 250 are sealed between the passivation layers 240, 260. In addition, the passivation layer 260 can be mixed with the polymeric material, i.e. parylene or polytetra-fluoroethylene (PTFE), to further prevent the organic electro-luminescence display 200 from being damaged by the outside moisture significantly.

Because the organic electro-luminescence devices 220 and the patterned separator structure 230 of the invention are completely covered by the passivation layers 240 and 260, the color filters 250 can be directly formed on the passivation layer 240 and the organic electro-luminescence display 200 can be shielded from moisture by utilized the passivation layer 260 instead of the conventional process where the color filters 250 are only formed after the organic electro-luminescence devices 220 are sealed by a glass substrate. Therefore, compared with the conventional skill, the invention can effectively decrease the number of the glass substrates utilized to reduce the thickness of the display apparatus and the fabricating cost.

FIGS. 3A to 3D are cross sectional views showing a process of fabricating organic electro-luminescence display according to one embodiment of the invention.

Figure 3A:
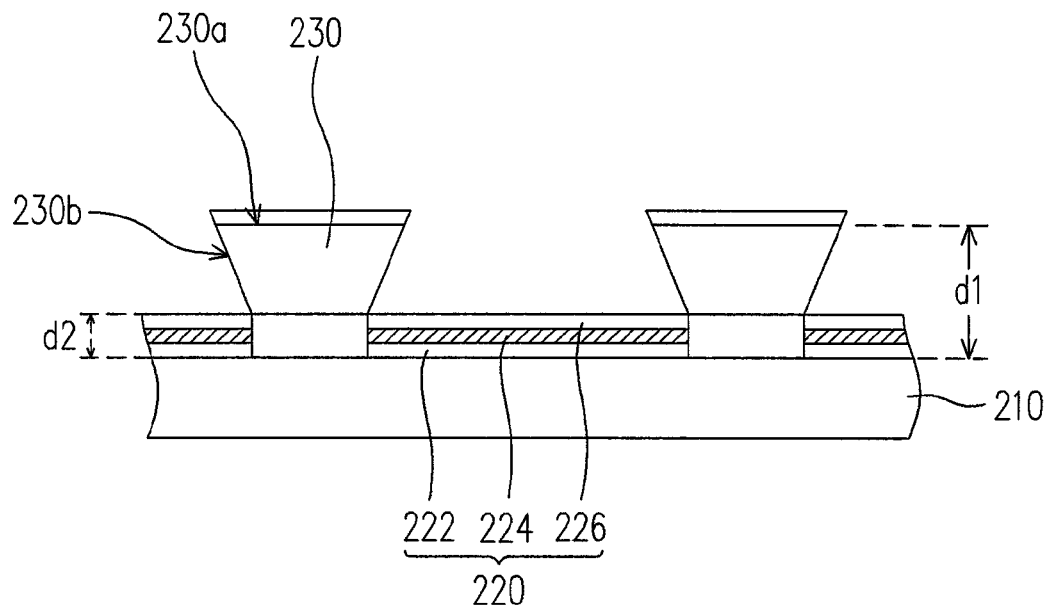
FIGS. 3A to 3D are cross sectional views showing a process of fabricating organic electro-luminescence display according to one embodiment of the invention.

As shown in FIG. 3A, in one embodiment of the invention, the process of fabricating organic electro-luminescence display, comprises the following steps. First, a substrate 210, a plurality of organic electro-luminescence devices 220 and a patterned separator structure 230 are provided, wherein the organic electro-luminescence devices 220 and the patterned separator structure 230 are disposed over the substrate 210. The patterned separator structure 230 separates the organic electro-luminescence devices 220, and the thickness d1 of the patterned separator structure 230 is greater than thickness d2 of the organic electro-luminescence devices 220.

Figure 3B:
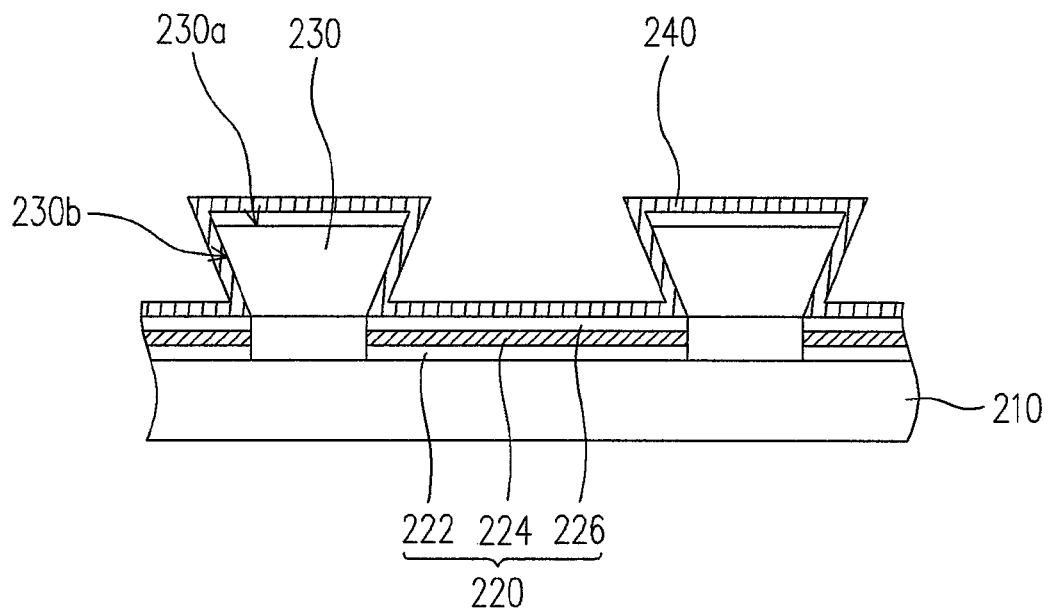

Next, as shown in FIG. 3B, a passivation layer 240 is formed to completely cover the patterned separator structure 230 and the organic electro-luminescence devices 220. In one embodiment, the process of fabricating the passivation layer 240, such as the plasma diffusion process, starts when the material of the passivation layer 240 is ionized by plasma, and then these ions are diffused onto the organic electro-luminescence devices 220 and the top and side surfaces 230a, 230b of the patterned separator structure 230 to form a complete and connected passivation layer 240. The complete and connected passivation layer 240 can be a substitute for the glass substrate used in conventional skill to prevent the organic electro-luminescence devices 220 from being damaged by the organic solvent.

Figure 3C:
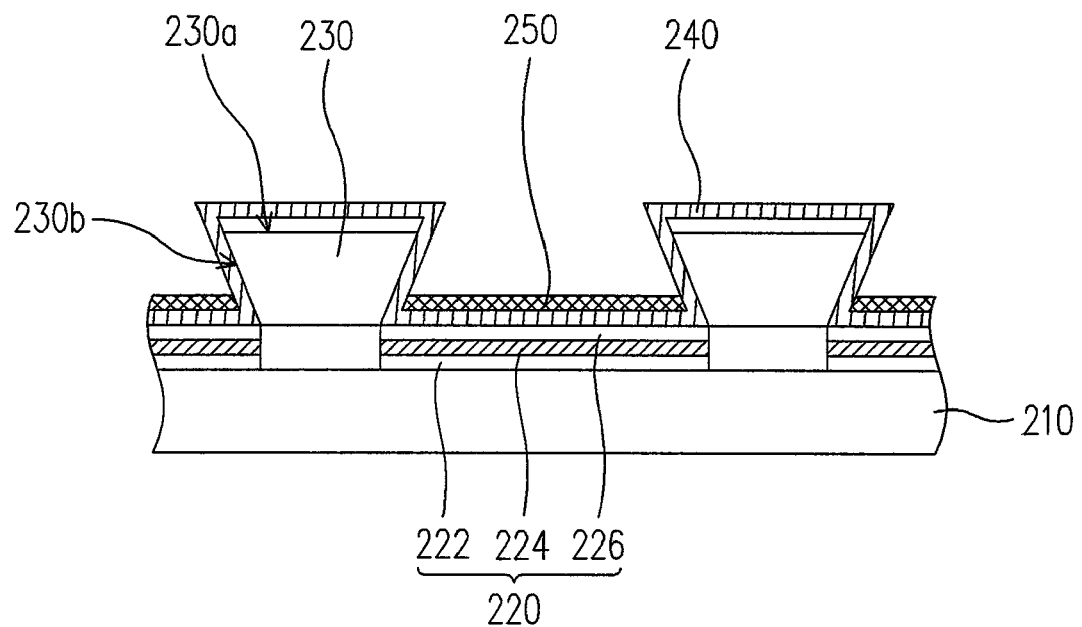

Next, as shown in FIG. 3C, the color filters 250 are formed on the passivation layer 240, wherein each of the color filters 250 is located above each of the organic electro-luminescence devices 220. The process of forming the color filters 250 can be an ink printing process. When the light emitted from the organic electro-luminescence devices 220 passes through each of the color filters 250, the organic electro-luminescence display 200 can thereby display full colors.

Figure 3D:
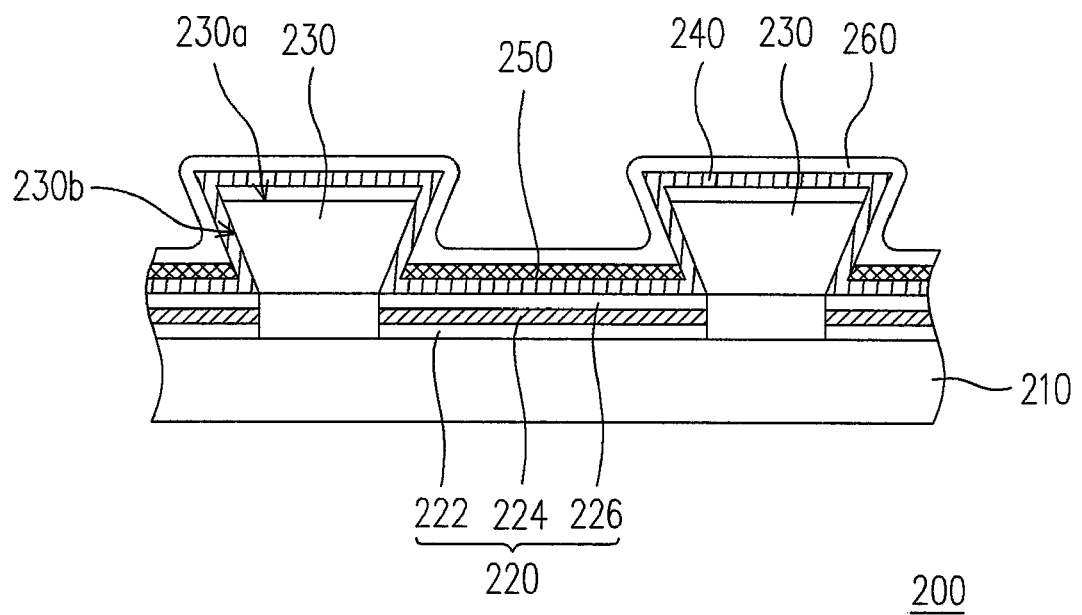

As shown in FIG. 3D, another passivation layer 260 can further completely cover the passivation layer 240 and the color filters 250, wherein the color filters 250 are sealed between the passivation layers 240, 260. Furthermore, the complete and continuous passivation layer 260 can be mixed with the polymeric material, i.e. parylene or polytetra-fluoroethylene (PTFE), to further prevent the organic electro-luminescence display 200 from being damaged by the outside moisture significantly.

Because the organic electro-luminescence devices are completely covered by the passivation layer and then the color filters are formed over the passivation layer, the invention can effectively prevent the organic luminescent layer from contact with the solvent used in the process. In addition, compared with the conventional skill, the process of fabricating the organic electro-luminescence devices and the color filters over the same substrate in the invention not only simplifies the whole fabricating process but also reduces its fabricating cost and the thickness of the display apparatus.

Figure 4:
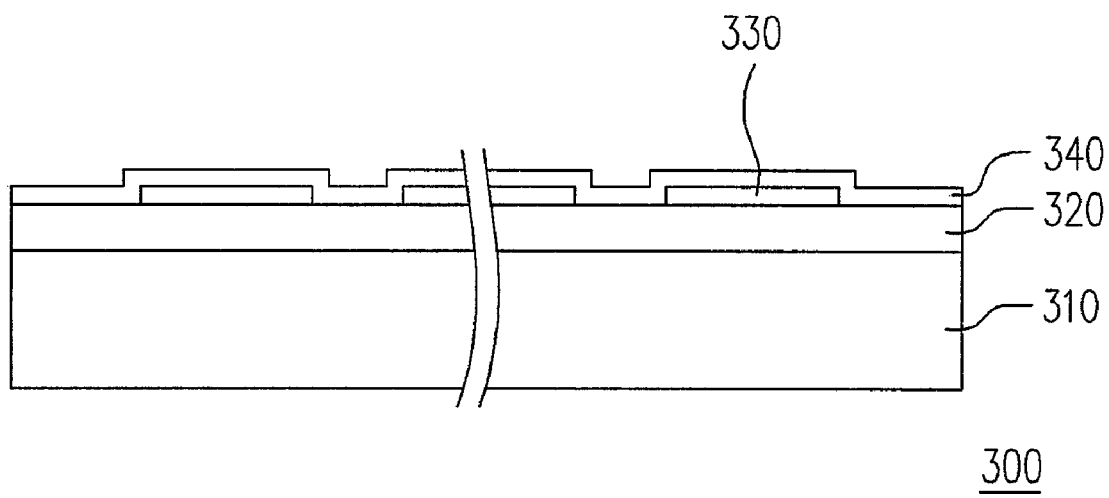
FIG. 4 is a cross sectional view of an organic electro-luminescence display according to another embodiment of the invention.

FIG. 4 is a cross sectional view of an organic electro-luminescence display according to another embodiment of the invention. The organic electro-luminescence display 300 comprises an organic electro-luminescence device array 310, a passivation layer 320 and a plurality of color filters 330.

As shown in FIG. 4, the passivation layer 320 completely covers the organic electro-luminescence device array 310, and the color filters 330 are disposed on the passivation layer 320. In one embodiment, the color of the organic electro-luminescence device array 310 can be white light, and the types thereof comprise the active matrix or the passive matrix, wherein the active components of the active matrix organic electro-luminescence device array can be diodes or thin film transistors.

Furthermore, in one embodiment, the colors of the color filters can be red, green and blue. By mixture and combination of the red, green and blue colors, the organic electro-luminescence display 300 can achieve the full-color display purpose. In addition, the organic electro-luminescence display 300 further comprises a passivation layer 340 to cover the passivation layer 320 and the color filters 330. Wherein, the color filters 330 are sealed between the two passivation layers 320, 340.

To sum up, compared with the conventional skill, the invention, the organic electro-luminescence display and process of fabricating the same, has the following advantages:

(1) In the invention, a passivation layer is formed over the organic electro-luminescence devices first and then the color filters are formed on the passivation layer. This process can reduce the number of the glass substrates used and the thickness of the display apparatus.

(2) The passivation layer being complete and connected, can prevent the organic electro-luminescence display from being damaged by the moisture in the air and the organic solvents and thus prolongs the life of the organic electro-luminescence display.

(3) The organic electro-luminescence devices and the color filters are formed over the same substrate in the invention. This simplifies the fabricating process and lowers the cost.

(4) With the color filters, the organic electro-luminescence devices can use the same material to avoid using the conventional organic electro-luminescence materials of different life spans, and then the color saturation can be kept steady.

The above description provides a full and complete description of the embodiments of the invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An organic electro-luminescence display comprising:
  an organic electro-luminescence device array comprising a plurality of organic electro-luminescence devices and a patterned separator structure, the patterned separator structure separating the organic electro-luminescence devices and having a cross-section of an inverted trapezium;
  a first passivation layer completely covering organic electro-luminescence device array and covering the sidewall of the patterned separator structure; and a plurality of color filters disposed on the first passivation layer.

2. The organic electro-luminescence display of claim 1, wherein the color filters comprise a plurality of red color filters, green color filters, or blue color filters.

3. The organic electro-luminescence display of claim 1, wherein the organic electro-luminescence device array comprises a white light organic electro-luminescence device array.

4. The organic electro-luminescence display of claim 1, wherein the type of the organic electro-luminescence device array comprises an active matrix array.

5. The organic electro-luminescence display of claim 1, wherein the type of the organic electro-luminescence device array comprises a passive matrix array.

6. The organic electro-luminescence display of claim 1, further comprising a second passivation layer to completely cover the first passivation layer and the color filters.

7. The organic electro-luminescence display of claim 1, wherein a material of the first passivation layer comprises a transparent material.

* * * * *